(12) United States Patent
Zenou et al.

(10) Patent No.: US 12,089,343 B2
(45) Date of Patent: Sep. 10, 2024

(54) METHODS FOR PRINTING A CONDUCTIVE PILLAR WITH HIGH PRECISION

(71) Applicant: Reophotonics, Ltd., Modiin (IL)

(72) Inventors: Michael Zenou, Hashmonaim (IL); Stéphane Etienne, Bouaye (FR)

(73) Assignee: REOPHOTONICS, LTD., Modiin (IL)

( * ) Notice: Subject to any disclaimer, the term of this patent is extended or adjusted under 35 U.S.C. 154(b) by 0 days.

(21) Appl. No.: 17/929,114

(22) Filed: Sep. 1, 2022

(65) Prior Publication Data
US 2024/0080992 A1    Mar. 7, 2024

(51) Int. Cl.
| | | |
|---|---|---|
| H05K 3/12 | (2006.01) | |
| B41M 5/00 | (2006.01) | |
| C23C 14/28 | (2006.01) | |
| C23C 14/58 | (2006.01) | |

(52) U.S. Cl.
CPC ......... H05K 3/1291 (2013.01); B41M 5/0041 (2013.01); C23C 14/28 (2013.01); C23C 14/5806 (2013.01); H05K 2203/107 (2013.01); H05K 2203/1105 (2013.01)

(58) Field of Classification Search
CPC ...... H05K 3/12; H05K 3/1283; H05K 3/1241; H05K 3/125; H05K 3/108; H05K 3/046; H05K 3/225; H05K 3/227; H05K 3/1291; H05K 2203/107; H05K 2203/1105; C23C 14/28; C23C 14/5806; B41M 5/0041; B33Y 10/00; B22F 10/10; B22F 10/18;
(Continued)

(56) References Cited

U.S. PATENT DOCUMENTS

| | | | | |
|---|---|---|---|---|
| 4,752,455 A | * | 6/1988 | Mayer | B23K 20/08 |
| | | | | 219/121.6 |
| 5,667,884 A | * | 9/1997 | Bolger | H01L 21/6835 |
| | | | | 428/323 |

(Continued)

FOREIGN PATENT DOCUMENTS

| | | |
|---|---|---|
| JP | S6281772 A | 4/1987 |
| JP | 2012-142490 A | 7/2012 |

OTHER PUBLICATIONS

Serra; et al., "Laser-Induced Forward Transfer: Fundamentals and Applications", Advanced Materials Technology, Aug. 8, 2018, 120 pgs.

(Continued)

*Primary Examiner* — Michael P Wieczorek
(74) *Attorney, Agent, or Firm* — Ascenda Law Group, PC

(57) ABSTRACT

Methods for creating a conductive pillar on a receiver substrate may include forming a dried metal paste pillar by printing metal paste over an area of a receiver substrate, drying the metal paste, and repeating the printing and drying steps. The dried metal paste pillar may be inspected so as to determine a height of the dried metal paste pillar. If the height of the dried metal paste pillar is less than a desired height, additional metal paste may be printed onto to the dried metal paste pillar and dried. If the height of the dried metal paste pillar exceeds the desired height, a portion of the dried metal paste pillar may be ablated. The dried metal paste pillar may be sintered so as to form the conductive pillar. Conductive pillars that are produced according to the methods may be used as part of the formation of a flip-chip assembly.

12 Claims, 12 Drawing Sheets

(58) Field of Classification Search
CPC .......... B22F 10/30; B22F 10/31; B22F 10/38; B22F 10/50; B22F 10/80; B22F 10/85
See application file for complete search history.

(56) References Cited

U.S. PATENT DOCUMENTS

| | | | | |
|---|---|---|---|---|
| 6,805,918 | B2* | 10/2004 | Auyeung | C23C 14/048 427/595 |
| 2017/0071062 | A1 | 3/2017 | Noy | |
| 2020/0324486 | A1* | 10/2020 | Mantell | B29C 64/112 |
| 2020/0350275 | A1* | 11/2020 | Zenou | C09D 11/101 |
| 2021/0013375 | A1* | 1/2021 | Wu | H01L 33/62 |
| 2021/0028141 | A1* | 1/2021 | Zenou | H01L 24/92 |
| 2022/0256698 | A1 | 8/2022 | Zenou et al. | |

OTHER PUBLICATIONS

Van Assenbergh et al., "Nanostructure and Microstructure Fabrication: From Desired Properties to Suitable Processes", Small, Mar. 2018, 1703401, pp. 1-24.

Wei; et al., "An overview of laser-based multiple metallic material additive manufacturing: from macro- to micro-scales", International Journal of Extreme Manufacturing (2021), 3:012003, pp. 1-24.

Zenou; et al., "Laser jetting of femto-liter metal droplets for high resolution 3D printed structures", Scientific Reports, Nov. 5, 2015, 5:17265, pp. 1-10.

Zenou; et al., "Printing of metallic 3D micro-objects by laser induced forward transfer", Optics Express, OSA, Jan. 19, 2016, 24(2):1431-1446.

Arutinov; et al., "Integration with Light", 2018 7th Electronic System-Integration Technology Conference (ESTC), IEEE, Sep. 18, 2018, pp. 1-5.

International Search Report and Written Opinion mailed Nov. 30, 2023, from the ISA/European Patent Office, for International Patent Application No. PCT/IB2023/058363 (filed Aug. 22, 2023), 15 pgs.

Zacharatos; et al., "Laser-Induced Forward Transfer (LIFT) Technique as an Alternative for Assembly and Packaging of Electronic Components", IEEE Journal of Selected Topics in Quantum Electronics, Nov./Dec. 2021, 27(6):6000210.

\* cited by examiner

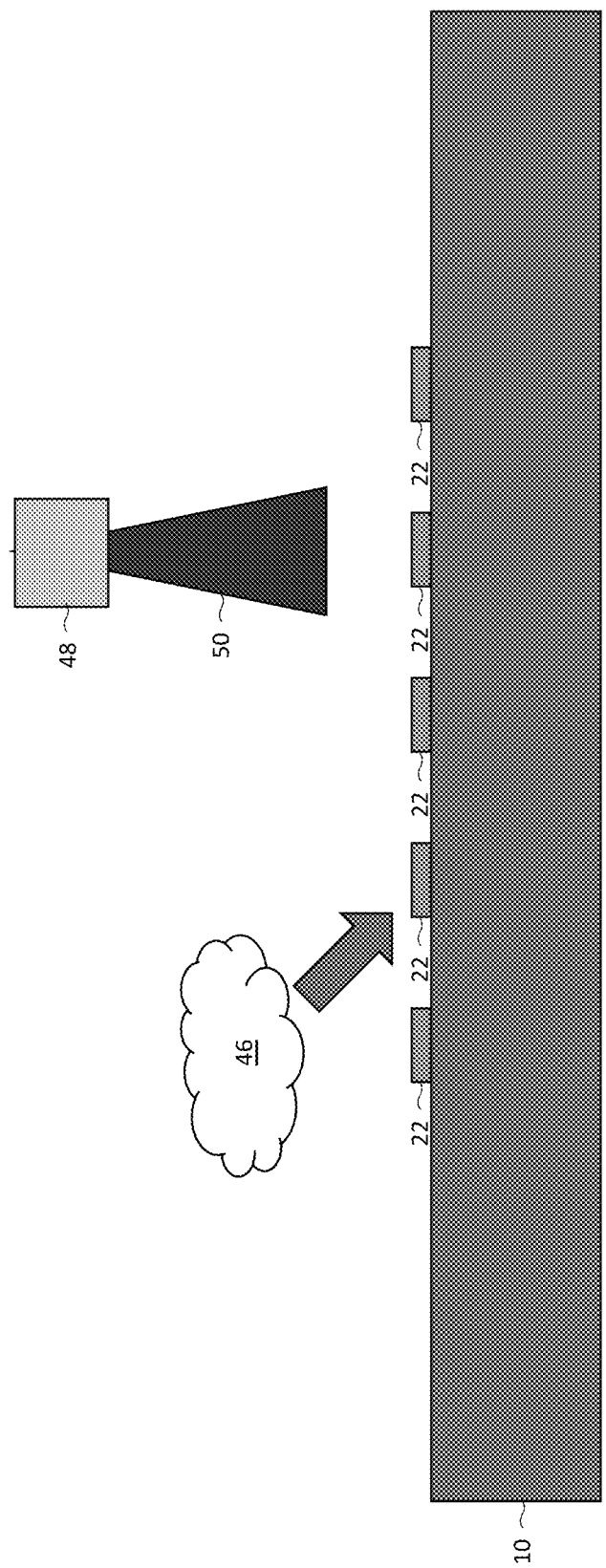

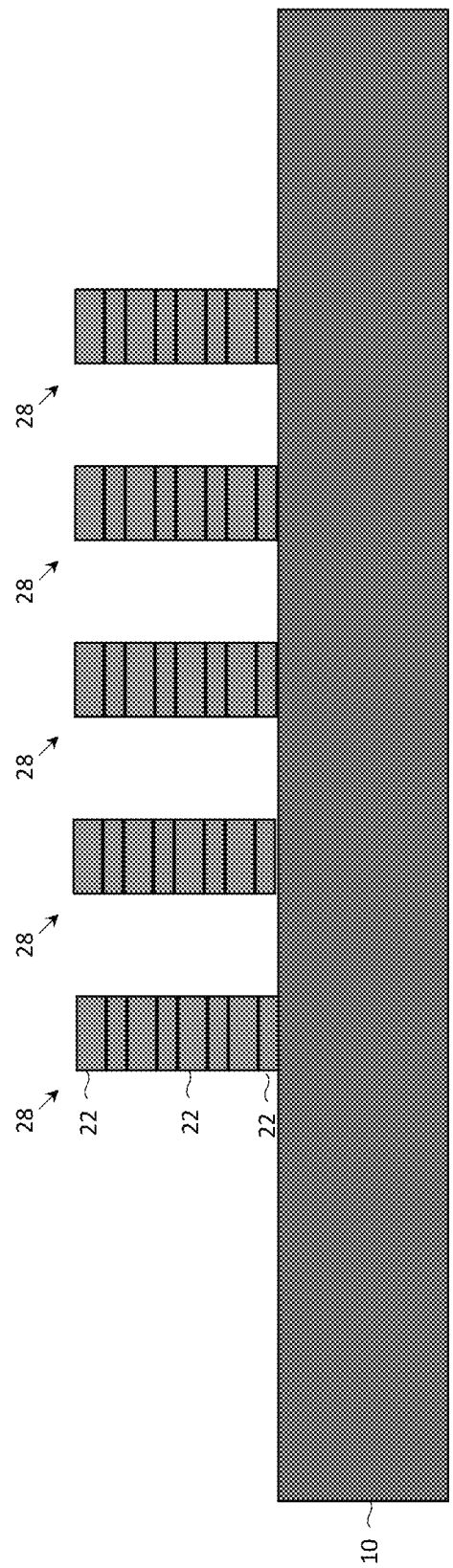

METHODS FOR PRINTING A CONDUCTIVE PILLAR WITH HIGH PRECISION

FIELD OF THE INVENTION

The present invention relates to systems and methods for printing a conductive pillar with high precision, and more specifically relates to a periodic inspection and correction process that is performed during the printing of the conductive pillar.

BACKGROUND

Flip chip bonding plays an important role in the packaging of semiconductor devices. In a flip chip microelectronic assembly, an electrical connection is formed between an electronic component and a substrate, such as circuit boards, using solder bumps as the interconnects. The use of flip chip packaging has grown because of the advantages in size, performance and flexibility flip chips have over other packaging methods.

Recently, copper pillar interconnects have been developed. Instead of using solder bumps, electronic components may be connected to substrates by copper pillars. The copper pillar interconnects provide finer pitches without bump bridging, and reduces the capacitance load of the circuits, in turn allowing the electronic components to operate at higher frequencies.

However, the interface of the copper pillar and the solder used to bond the electronic component may cause cracks to form along the pillar. The cracks can cause reliability issues due to high leakage currents and can lead to underfill cracking along the interface of the underfill and the copper pillar. In some instances, the cracks may propagate from the pillars to the underlying low dielectric layers of the substrate.

Therefore, there is a need for an improved method to form a conductive pillar with robust electrical performance for use in flip chip packaging.

SUMMARY OF THE INVENTION

In one embodiment of the present invention, a method produces conductive pillars (e.g., copper pillars) on substrates with high precision and at a high production rate.

In one embodiment of the present invention, the substrate may be a flexible substrate or a rigid substrate.

In one embodiment of the present invention, the conductive pillars that are formed by the method can be used as a building block for the construction an electronic device.

In one embodiment of the present invention, metal paste is printed on one or more regions of the substrate.

In one embodiment of the present invention, the printing process is performed using laser assisted deposition (LAD), in which metal paste is jetted from a donor film (i.e., coated with a layer of the metal paste) onto the substrate.

In other embodiments of the present invention, other printing techniques, such as inkjet or screen printing, may be used to print the metal paste onto the substrate. However, LAD is the preferred method for the current process, since as opposed to screen printing it is performed in a non-contact mode and it handles viscous materials much better than inkjet printing.

In one embodiment of the present invention, the metal paste that is used for the process is any conductive metal paste, such as a silver paste, copper paste, gold paste or a paste formed from a combination of metals to achieve a desired conductivity.

In one embodiment of the present invention, the metal pastes that are used in the process are in liquid form and contain metal particles dissolved in a solvent.

In one embodiment of the present invention, after printing the metal paste onto the substrate, the solvent may be evaporated by drying the metal paste at a temperature of 100-200° C. (or a temperature of 50-100° C.).

In one embodiment of the present invention, the drying may be performed by flowing a hot gas (e.g., hot air) over the metal paste, shining infra-red (IR) light from an IR light source onto the metal paste, or by any other drying process.

In one embodiment of the present invention, the drying time is 30-200 seconds.

In one embodiment of the present invention, an inspection device (e.g., a camera, a two-dimensional (2D) microscope or a three-dimensional (3D) microscope) is used to inspect the height and dimensions of the a dried metal paste pillar.

In one embodiment of the present invention, if the height of the dried metal paste pillar is less than a desired height, an additional layer of the metal paste may be printed so as to increase the height of the dried metal paste pillar. If the height of the dried metal paste pillar exceeds the desired height, a portion of the dried metal paste pillar may be ablated by a laser so as to decrease the height of the dried metal paste pillar.

In one embodiment of the present invention, the frequency of the inspection and correction processes may be varied. For example, the inspection and correction may be performed after every new dried layer of metal paste has been formed or once after several layers of the dried metal paste have been formed.

In one embodiment of the present invention, an aspect ratio of 10 between the height and the radii of a pillar can be achieved, and even an aspect ratio of 100 can be achieved for some types of metal pastes.

In one embodiment of the present invention, the dried metal paste pillar is sintered (e.g., by a laser, gas, or infrared (IR) light) so as to form a conductive pillar. The sintering causes metal particles within the dried metal paste pillar to fuse together, increasing the conductivity of the conductive pillar.

In one embodiment of the present invention, the sintering process is performed at a temperature of 150-300° C. (or 50-150° C.).

In one embodiment of the present invention, the heating of the metal paste and/or dried metal paste pillar is performed within an environment with inert gas to minimize the oxidation of the metal.

In one embodiment of the present invention, a conductive adhesive is printed on top of the conductive pillar using LAD or other printing techniques. To print such adhesive, a donor film with a conductive adhesive coating may be placed in direct contact with the pillars. A laser beam may be directed towards the pillars in order to locally detach the conductive adhesive coating from the donor film in regions directly above the pillars. More specifically, the laser may cause a small void (e.g., an air bubble) to form at the interface between the donor film and the conductive adhesive coating, causing the conductive adhesive coating to locally detach from the donor film.

In one embodiment of the present invention, the conductive adhesive that is printed on top of the pillar may exhibit a conical shape, a shape which is better suited for the process to attach the pillar to another substrate (or another component) that will typically follow the pillar production process.

In one embodiment of the present invention, substrates that contact each end of the pillar may require contacts made from specific materials. As such, on both ends of the pillar, an additional contact layer may be printed in the same manner as the other layers of the pillar were printed with one change: the material (or materials) used to print the contact layers will be different than the material used to print the other layers of the pillar.

These and further embodiments of the invention are described in greater detail below.

BRIEF DESCRIPTION OF THE DRAWINGS

The present invention is illustrated by way of example, and not limitation, in the Figures of the accompanying drawings, in which:

FIG. 1B depicts the layer of metal paste being dried so as to solidify the metal paste, in accordance with one embodiment of the present invention.

FIG. 1F depicts the pillars of dried metal paste after additional layers have been added to the respective pillars, in accordance with one embodiment of the present invention.

DETAILED DESCRIPTION

In the following detailed description of the preferred embodiments, reference is made to the accompanying drawings that form a part hereof, and in which are shown by way of illustration specific embodiments in which the invention may be practiced. It is understood that other embodiments may be utilized and structural changes may be made without departing from the scope of the present invention. Descriptions associated with any one of the figures may be applied to different figures containing like or similar components.

Conductive pillar production has many important applications in the field of electronics. The present invention aims to simplify the process to form a stable pillar on a receiver substrate. The pillars that are formed using techniques described herein can be used as a building block for the fabrication of an electronic device (e.g., by depositing other layers and components).

Figure 1A:
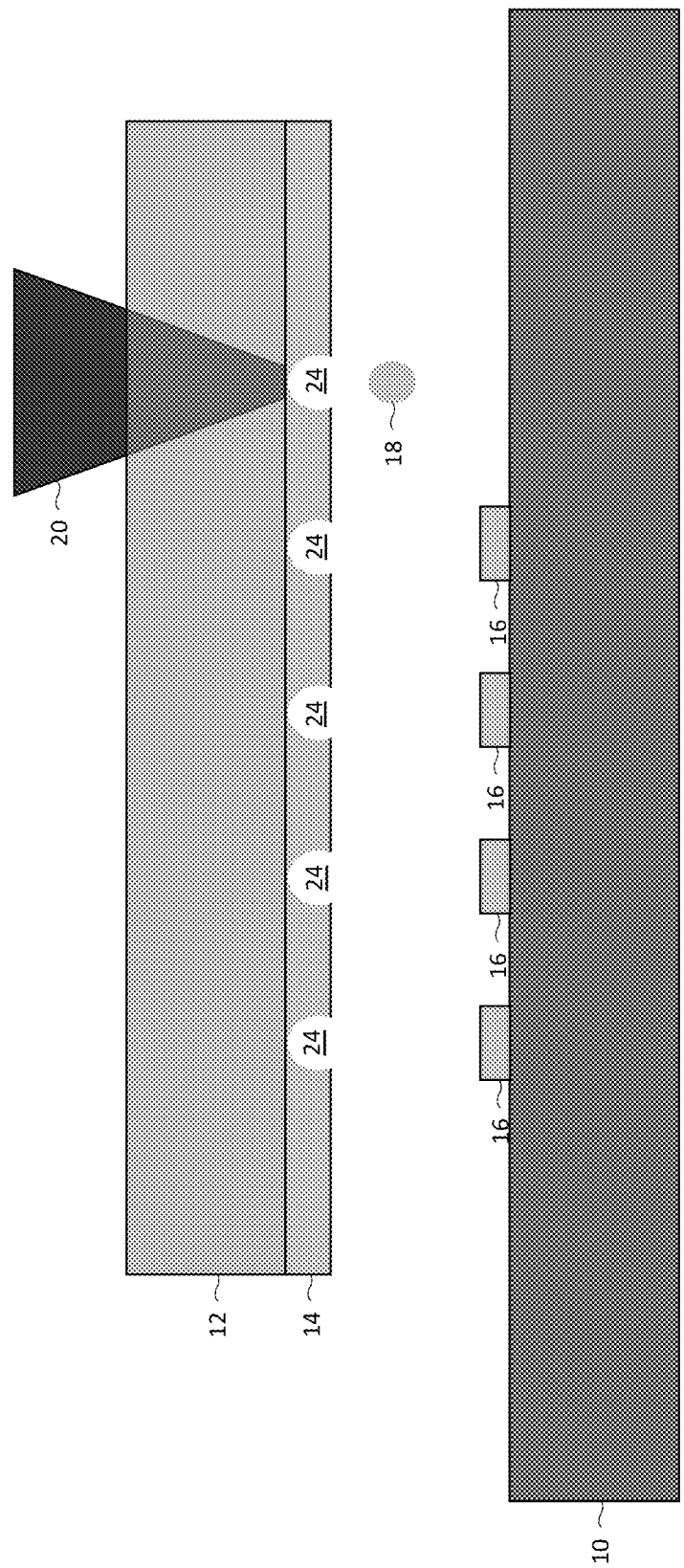
FIG. 1A depicts a first layer of metal paste being printed from a donor film onto certain regions of a receiver substrate, in accordance with one embodiment of the present invention.

FIGS. 1A-1F depict a process for forming a conductive pillar 30 on a receiver substrate 10. FIG. 1A depicts a layer of metal paste 16 being printed on certain regions of the receiver substrate 10. The printing process is preferably performed by directing a laser beam 20 onto certain regions of a donor film 12 that has been coated with a metal paste 14. Preferably, the donor film 12 is transparent to the wavelength of the laser beam 20, allowing the laser beam 20 to pass through the donor film 12 and heat up the metal paste 14. The heating of the metal paste 14 by the laser beam 20 may cause droplets 18 of the metal paste 14 to be jetted or ejected from the donor film 12 onto the receiver substrate 10, leaving voids 24 in the metal paste coating 14. Such a process is known as laser assisted deposition (LAD) or laser induced forward transfer (LIFT). While other printing techniques can be used, such as inkjet or screen printing, LAD is the preferred method for the instant process. As opposed to screen printing, LAD is performed in a non-contact mode, and in contrast to inkjet printing, LAD is able to more easily print viscous materials such as silver or copper paste.

The metal paste 14 for the process may include any conductive metal paste, such as silver paste or copper paste. Other options include gold paste or a paste formed by a combination of metals to achieve a desired conductivity. The metal pastes 14 that are used in the process are all liquid in nature and they typically contain metal particles that are dissolved within a solvent. Additives may also be present in the metal paste 14.

As shown in FIG. 1B, after the layer of metal paste 16 has been formed on certain regions of the receiver substrate 10, the solvent may be evaporated to form a solid structure (i.e., dried metal paste 22). Typically, the solvent is evaporated by drying the metal paste 16 at a temperature between 100-200° C. The drying may be performed by flowing a hot gas 46 (e.g., hot air) over the metal paste 16, shining infra-red (IR) light 50 from an IR light source 48 onto the metal paste 16, or by any other known drying process. Typically, the drying step is performed for 30 to 200 seconds.

Figure 1C:
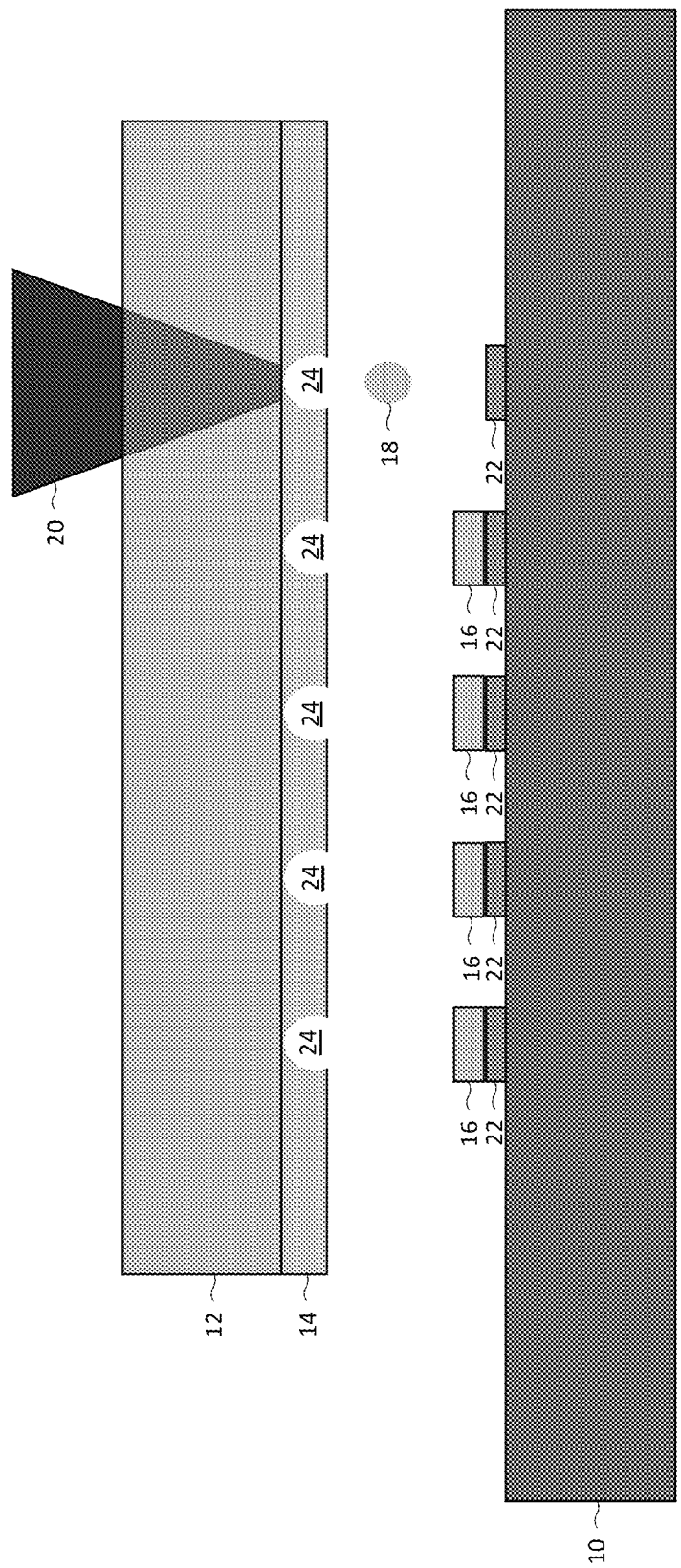
FIG. 1C depicts a second layer of metal paste being printed on top of the layer of dried metal paste, in accordance with one embodiment of the present invention.
Figure 1D:
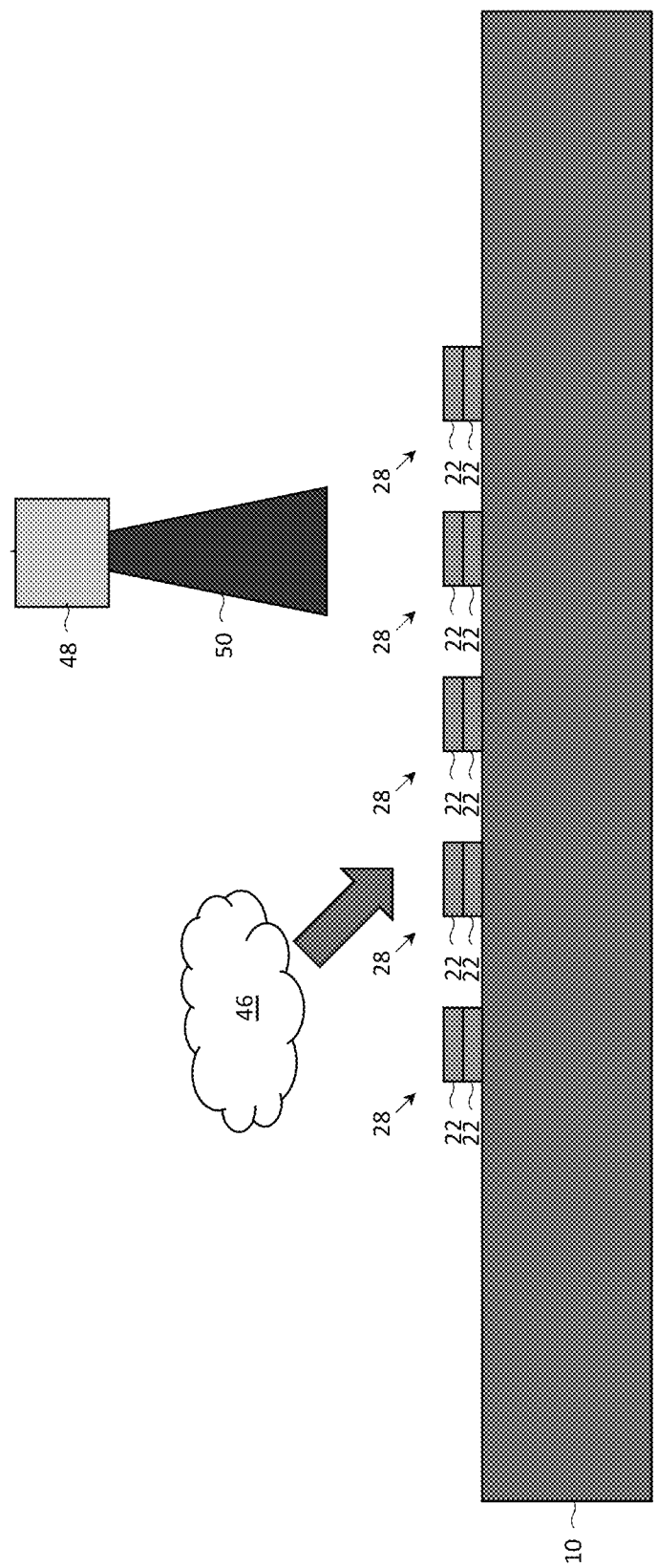
FIG. 1D depicts the second layer of metal paste being dried so as to form pillars of dried metal paste, in accordance with one embodiment of the present invention.

As shown in FIG. 1C, an additional layer of metal paste 16 may be printed on top of the dried metal paste 22. As shown in FIG. 1D, such additional layer of metal paste 16 may be dried to form pillars of dried metal paste 28.

Figure 1E:
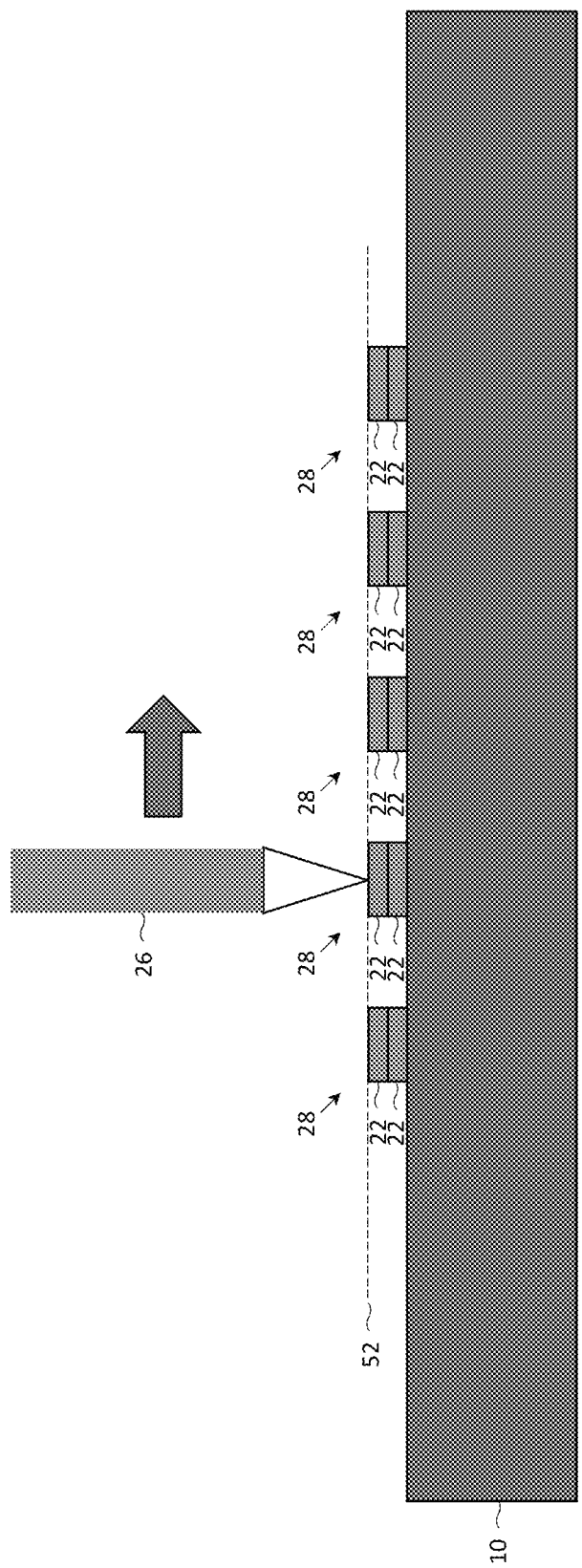
FIG. 1E depicts the pillars of dried metal paste being inspected by an inspection device, in accordance with one embodiment of the present invention.

As shown in FIG. 1E, an inspection process may be performed in order to increase the accuracy of the pillar formation process. Using an inspection device 26 (e.g., a camera, a two-dimensional (2D) microscope or a three-dimensional (3D) microscope), the height and dimensions (e.g., circularity and radii) of the pillars of dried metal paste 28 may be measured. In the particular example of FIG. 1D, all the pillars of dried metal paste 28 match a desired height 52, so no correction step is necessary.

Figure 5:
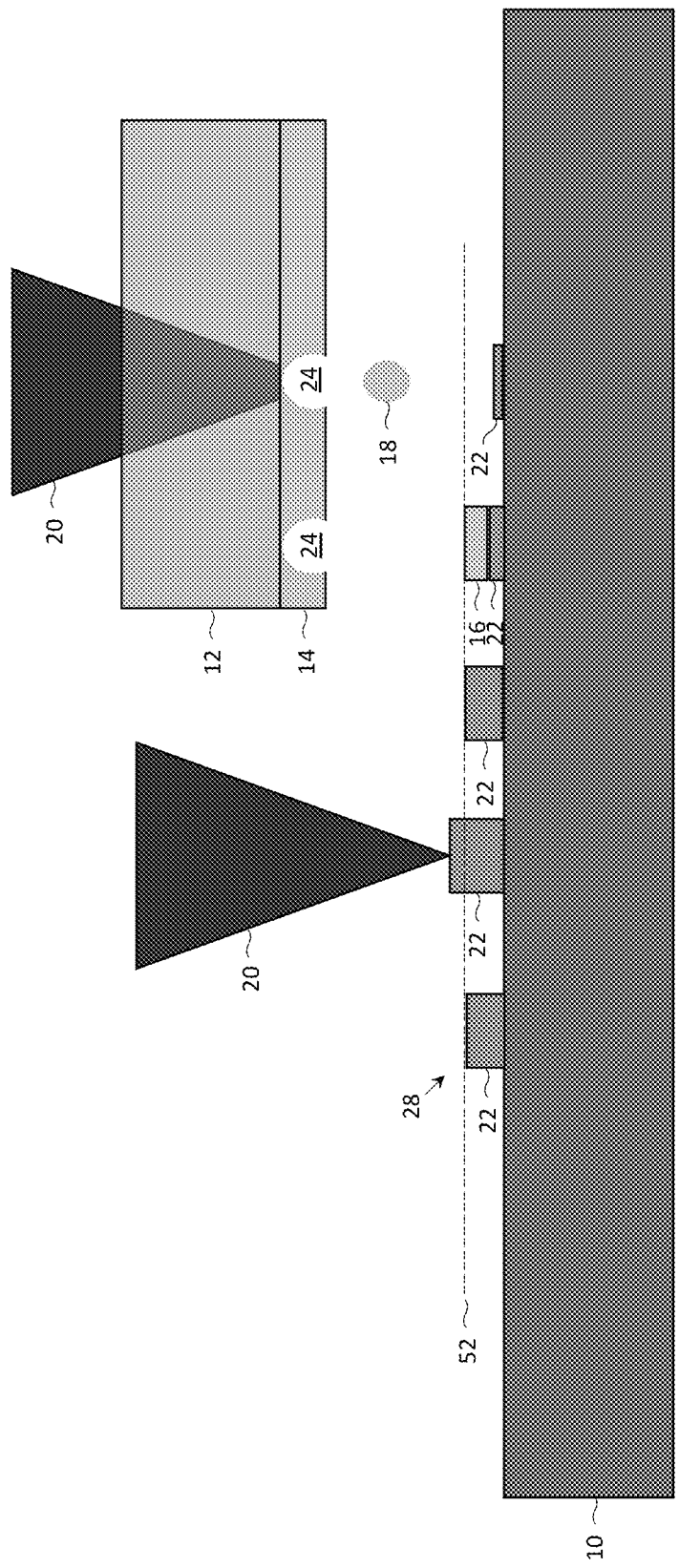
FIG. 5 depicts processes to correct the height of respective conductive pillars, in accordance with one embodiment of the present invention.

However, as shown in FIG. 5, if the height of a dried metal paste pillar 28 is less than a desired height 52, an additional layer of the metal paste 16 may be printed (and dried similar to the process depicted in FIGS. 1B and 1D) so as to increase the height of the dried metal paste pillar 28. If the height of a dried metal paste pillar 28 exceeds the desired height 52, the dried metal paste pillar 28 may be ablated by a laser 20 (e.g., a high energy laser) so as to decrease the height of the dried metal paste pillar 28. During the ablation process, the height of the dried metal paste pillar 28 may be periodically inspected so as to determine when a sufficient amount of the material has been ablated.

It is noted that the frequency of the inspection and correction processes may be varied. For example, the inspection and correction may be performed after every new dried layer of metal paste 22 has been formed or once after several layers of the dried metal paste 22 have been formed.

FIG. 1F depicts the pillars of dried metal paste 28 after additional layers have been added to the respective pillars. At the end of the printing process, a very high aspect ratio between the height and the radii of the respective pillars can be achieved. For example, an aspect ratio of 10 can be achieved, and even an aspect ratio of 100 can be achieved for some types of metal pastes.

Figure 2:
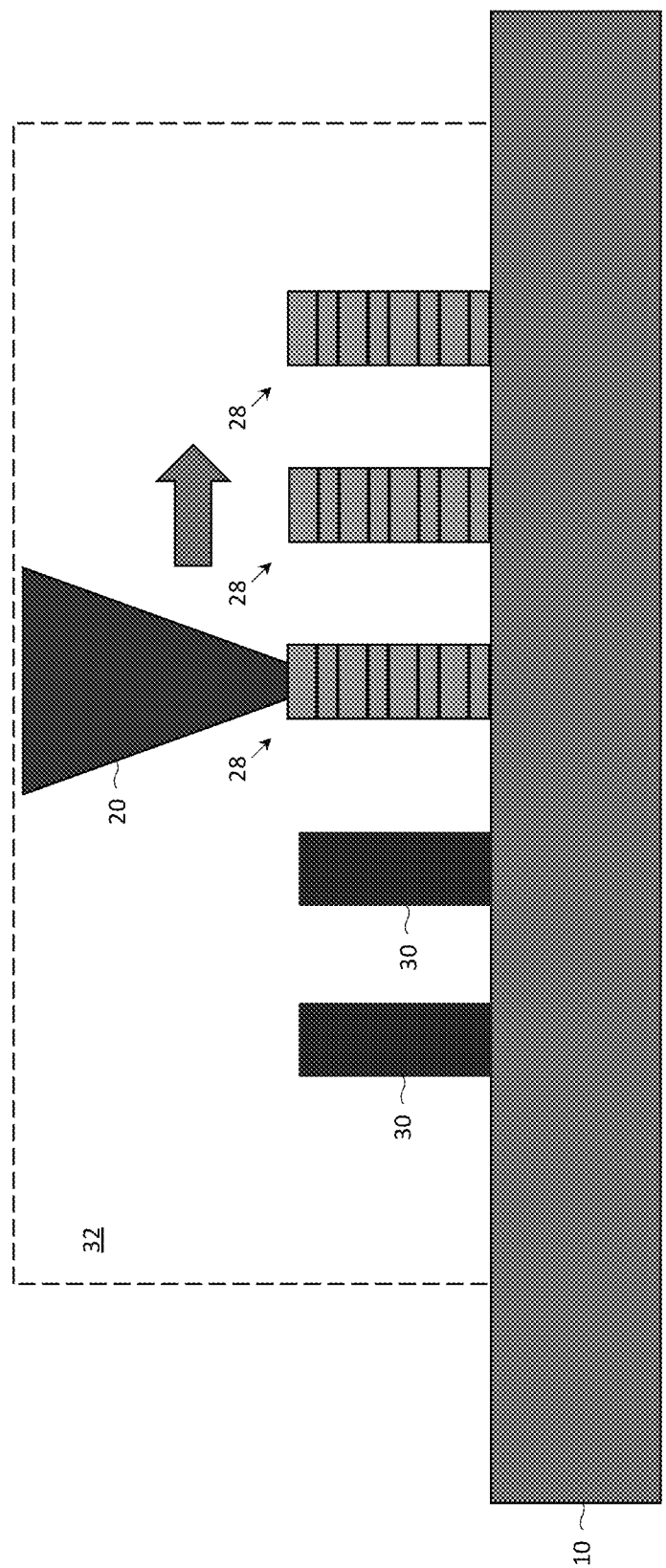
FIG. 2 depicts the pillars of the dried metal paste being sintered (e.g., by laser, hot gas, or infrared (IR) light) so as to form conductive pillars, in accordance with one embodiment of the present invention.

FIG. 2 depicts the pillars of the dried metal paste 28 being sintered (e.g., by a laser, a hot gas, or an infrared (IR) light) so as to form conductive pillars 30. The sintering causes metal particles within the dried metal paste pillars 28 to fuse together, increasing the conductivity of the conductive pillar 30. The intensity of sintering may affect the overall conductivity of the conductive pillar 30, as a higher intensity will cause more metal particles to fuse together. The sintering process is typically performed at higher temperatures (e.g., 150-300° C.) than the drying process. Therefore, for metals that tend to be oxidized, like copper, the sintering process can be harmful and result in an oxidized copper with a lower conductivity. To address such challenges, the sintering (and/or the drying) can be performed in an environment 32 with an inert gas (e.g., Ar, $CO_2$, He, Ne, etc.) that displaces the oxygen in the ambient air, which can oxidize metals.

Typically, the conductive pillars 30 will need to be electrically connected to other electronic components (e.g., circuits, resistors, capacitors, conductive traces, etc.) and that can be achieved by depositing a conductive adhesive (such as solder paste or another conductive adhesive) on top of the pillars 30. In one approach, the conductive adhesive can be printed by screen printing or inkjet printing. In another approach, the conductive adhesive can be printed in the same way as the metal paste was printed (e.g., with a donor foil suspended over the target printing locations via LAD), but a simpler approach described below can be employed.

Figure 3A:
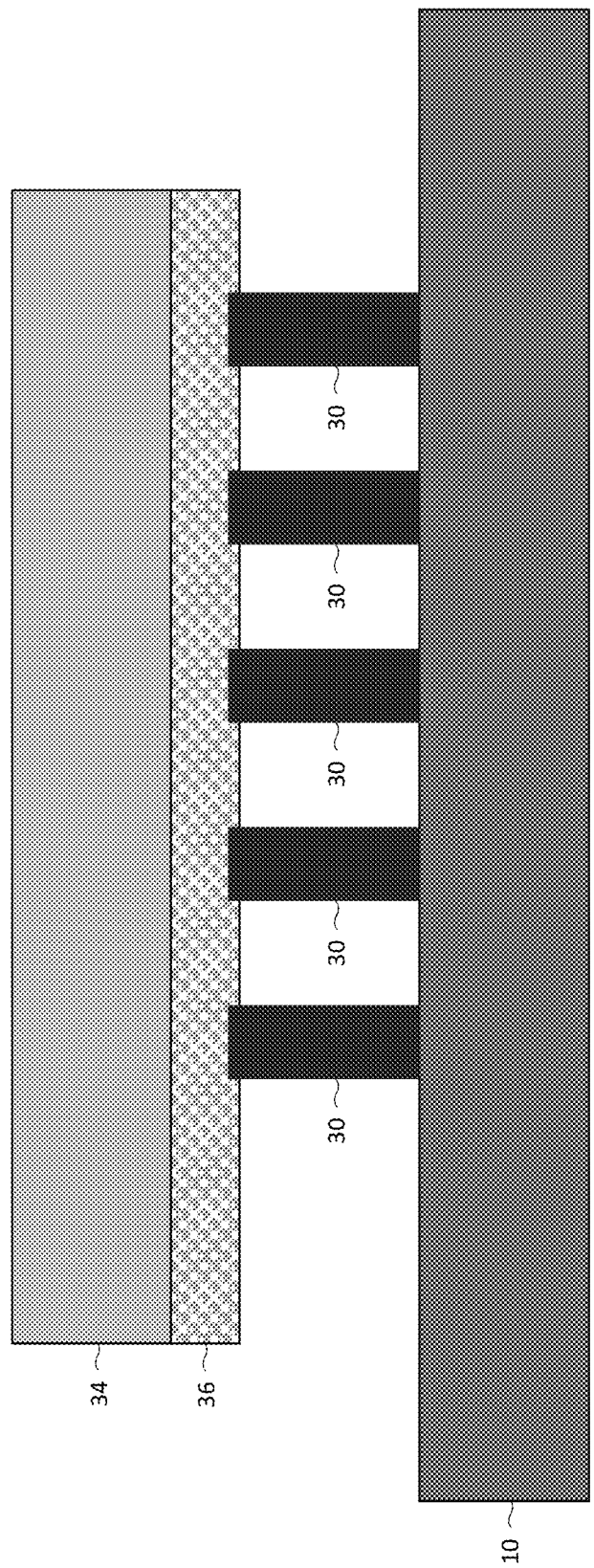
FIG. 3A depicts a donor film with a conductive adhesive coating being placed on top of the conductive pillars, in accordance with one embodiment of the present invention.
Figure 3B:
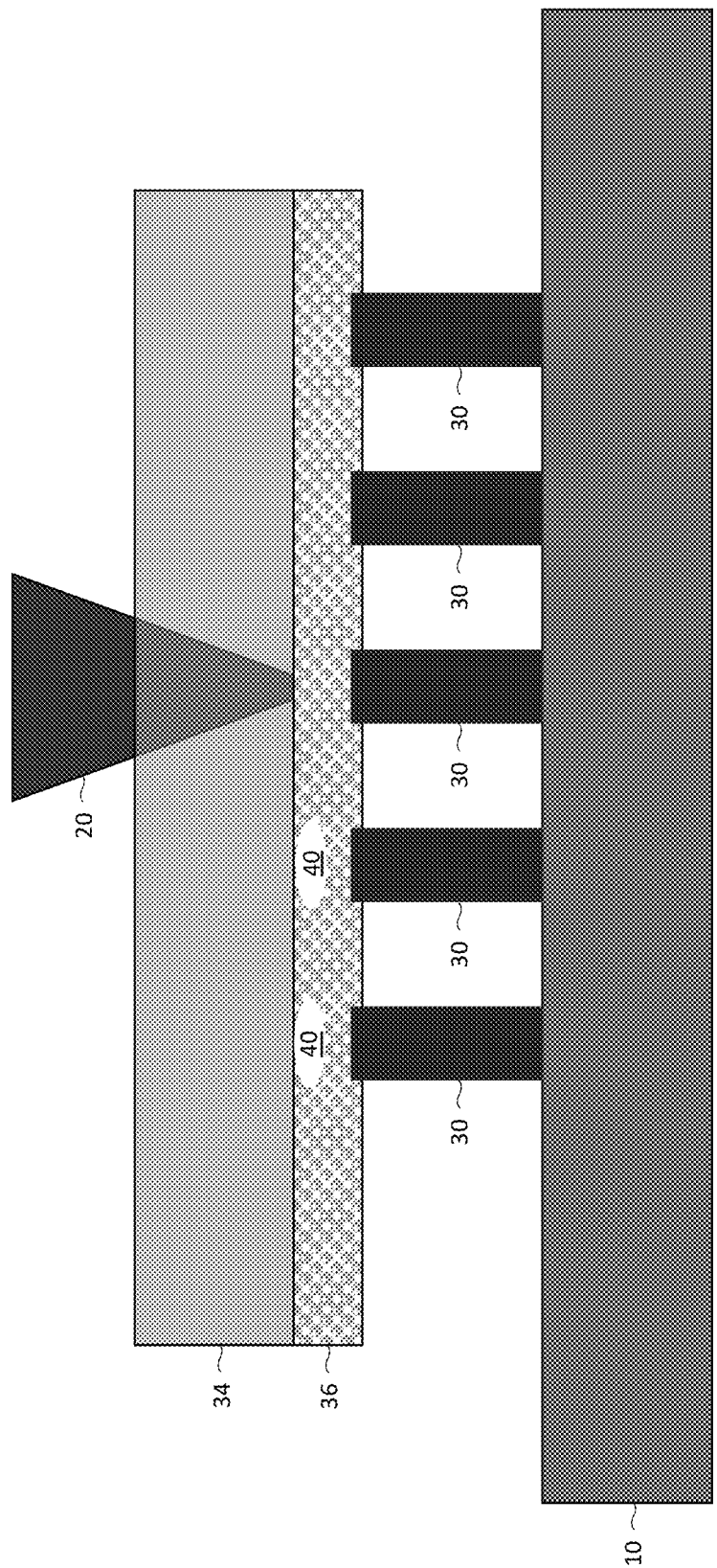
FIG. 3B depicts a laser beam being used to separate the conductive adhesive coating from regions of the donor film directly over the conductive pillars, in accordance with one embodiment of the present invention.
Figure 3C:
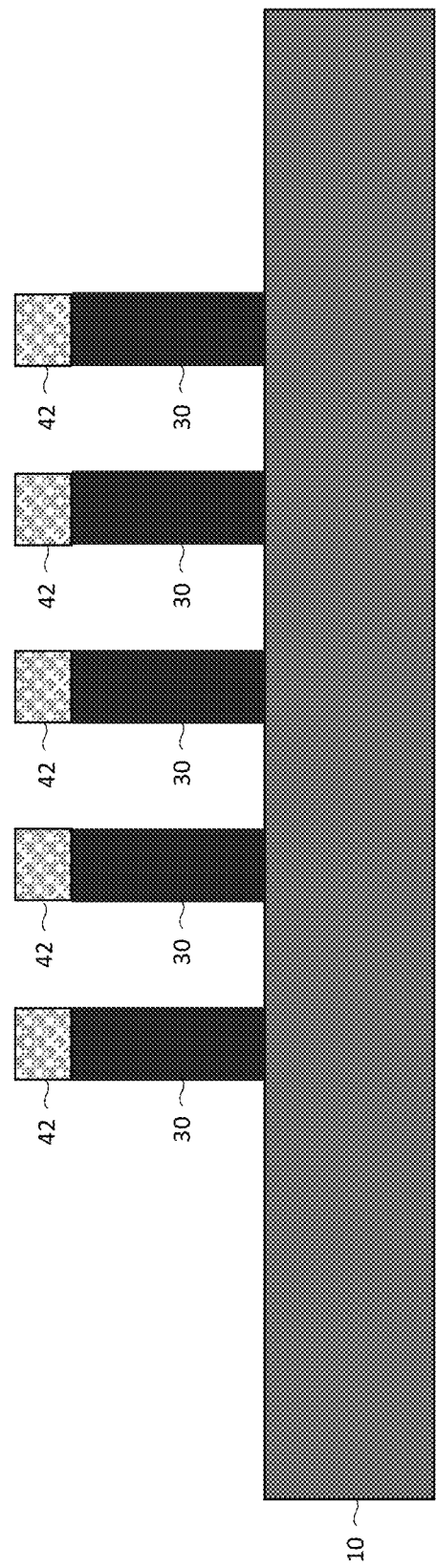
FIG. 3C depicts the resulting structure after the donor film with the conductive adhesive coating has been removed, in accordance with one embodiment of the present invention.

FIGS. 3A-3C illustrate a process to print a conductive adhesive 42 onto the top surface of the conductive pillars 30. As depicted in FIG. 3A, a donor film 34 with a conductive adhesive coating 36 (with the conductive adhesive coating 36 facing the pillars 30) may be placed in direct contact with the pillars 30. As depicted in FIG. 3B, a laser beam 20 may be directed towards the pillars 30 in order to locally detach the conductive adhesive coating 36 from the donor film 34 in regions directly above the pillars 30. More specifically, the laser 20 may cause a small void 40 (e.g., air bubble) to form at the interface between the donor film 34 and the conductive adhesive coating 36, causing the conductive adhesive coating 36 to locally detach from the donor film 34. The adhesive cohesive energy of the adhesive coating 36, however, is high enough so regions that were not irradiated by the laser beam 20 will still adhere to the donor film 34.

FIG. 3C depicts the resulting structure after the donor film 34 with the adhesive conductive coating 36 has been removed. As shown in FIG. 3C, the top surface of the pillars 30 are now coated with a conductive adhesive layer 42. The conductive adhesive layer 42 may exhibit a conical shape (not shown), a shape which is better suited for the process to attach the conductive pillars 30 to another substrate (or another component) that will typically follow the pillar production process. Any adhesive that remains on the donor film 34 may be recycled (e.g., deposited on other pillars that are subsequently formed).

Figure 4:
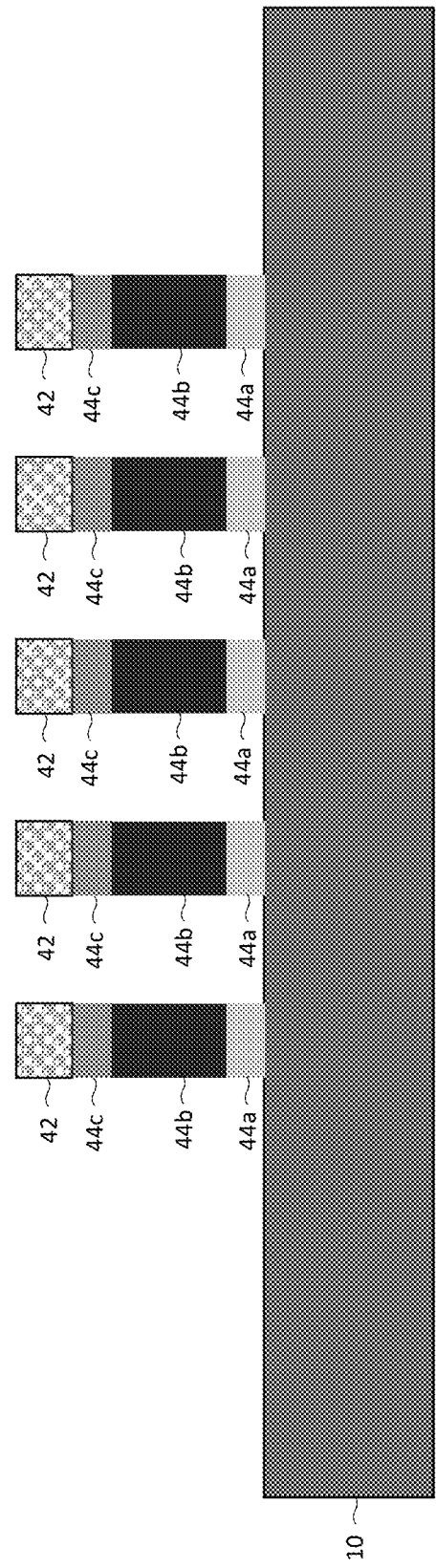
FIG. 4 depicts contact layers (i.e., top and bottom layers) of the respective conductive pillars being formed from different types of materials, in accordance with one embodiment of the present invention.

As depicted in FIG. 4, the pillars 30 may include different conductive materials for the contact layers (i.e., the top layer 44c and the bottom layer 44a of the pillars 30). More specifically, the top layer 44c of each of the pillars 30 may, after subsequent process steps, be placed in contact with another substrate, a conductive trace, etc. (not depicted). In the case that the receiver substrate 10 is a PCB board, the bottom layer 44a of each of the pillars 30 may be electrically connected to respective contacts of the PCB board.

As such, the type of metal used to form the bottom layer 44a may differ from the type of metal used to form the one or more intermediate layers 44b of each of the pillars 30 so as to form a better electrical connection (with lower resistance) with, e.g., the respective contacts of the PCB board. Similarly, the type of metal used to form the top layer 44c may differ from the type of metal used to form the one or more intermediate layers 44b of each of the pillars 30 so as to form a better electrical connection (with lower resistance) to a component electrically connected to the top end of the pillar 30. It is understood that the above-described printing processes can be adapted to print different metal pastes by using donor films that are coated with different types of metal pastes. Further, it is noted that the type of conductive adhesive 42 may be chosen to minimize corrosion on the two metallic surfaces that are being joined by the conductive adhesive 42.

Thus, methods for printing a conductive pillar with high precision have been described. Many other embodiments will be apparent to those of skill in the art upon reviewing the above description. The scope of the invention should, therefore, be determined with reference to the appended claims, along with the full scope of equivalents to which such claims are entitled.

LIST OF REFERENCE NUMERALS

10 Receiver Substrate
12 Donor Film
14 Metal Paste Coating
16 Metal Paste Layer
18 Droplet
20 Laser Beam
22 Dried Layer of Metal Paste
24 Void
26 Inspection Device
28 Dried Metal Paste Pillar
30 Conductive Pillar
32 Inert Environment
34 Donor Film
36 Conductive Adhesive Coating
40 Void
42 Adhesive Layer
44a Bottom Layer of Pillar
44b Intermediate Layers of Pillar
44c Top Layer of Pillar
46 Hot gas
48 Infrared (IR) Light Source
50 IR Light
52 Desired Height

What is claimed is:

1. A method of fabricating a conductive pillar, comprising:
forming a dried metal paste pillar by:
printing, by a laser-assisted deposition process and from a first film, a layer of metal paste over an area of a receiver substrate;
drying the layer of metal paste; and
repeating the printing and drying steps such that each successive layer of metal paste is printed on top of a previously dried layer of metal paste;
inspecting the dried metal paste pillar so as to determine a height of the dried metal paste pillar;
if the height of the dried metal paste pillar is less than a desired height, printing an additional layer of the metal paste onto the dried metal paste pillar and drying the additional layer of the metal paste so as to increase the height of the dried metal paste pillar;
if the height of the dried metal paste pillar exceeds the desired height, ablating a portion of the dried metal paste pillar so as to decrease the height of the dried metal paste pillar;
sintering the dried metal paste pillar so as to form the conductive pillar, wherein the conductive pillar comprises a bottom layer, one or more intermediate layers and a top layer, and wherein the bottom layer comprises a first type of metal, the one or more intermediate layers comprise a second type of metal different from the first type of metal, and the top layer comprises a third type of metal different from the second type of metal; and
depositing a conductive adhesive on a top surface of the top layer of the conductive pillar,
wherein depositing the conductive adhesive on the top surface of the top layer of the conductive pillar comprises:
placing a second film with a conductive adhesive coating on the top surface of the top layer of the conductive pillar, wherein the conductive adhesive coating comprises the conductive adhesive;
directing a laser beam onto the second film, causing a void to form at an interface between the second film and the conductive adhesive coating, which in turn causes a first portion of the conductive adhesive coating to detach from the second film, the first portion of the conductive adhesive coating adhering to the top surface of the top layer of the conductive pillar and exhibiting a conical shape; and
removing the second film from the top surface of the top layer of the conductive pillar along with a second portion of the conductive adhesive coating still adhering to the second film.

2. The method of claim 1, wherein the layer of metal paste is dried at a temperature between 100-200° C.

3. The method of claim 1, wherein the layer of metal paste is dried using a hot gas or an infra-red (IR) light source.

4. The method of claim 1, wherein drying the layer of metal paste comprises evaporating a solvent from the layer of metal paste.

5. The method of claim 1, wherein the dried metal paste pillar is sintered at a temperature between 150-300° C.

6. The method of claim 1, wherein the dried metal paste pillar is sintered by one or more of a laser, infra-red (IR) light or a hot gas.

7. The method of claim 1, wherein the metal paste comprises one or more of a silver paste, copper paste or gold paste.

8. The method of claim 1, wherein the receiver substrate is made from a flexible or rigid material.

9. The method of claim 1, wherein the dried metal paste pillar is inspected using one or more of a camera or a microscope.

10. The method of claim 1, wherein inspecting the dried metal paste pillar further comprises evaluating a circularity and a radii of the dried metal paste pillar.

11. The method of claim 1, wherein the drying and sintering steps are performed in an environment containing inert gas.

12. A method of fabricating a conductive pillar, comprising:
printing, by a laser-assisted deposition process and from a first film, one or more layers of metal paste onto a receiver substrate;
drying the one or more layers of metal paste to form a pillar of dried metal paste;
inspecting the dried metal paste pillar so as to determine a height of the dried metal paste pillar;
if the height of the dried metal paste pillar is less than a desired height, printing additional one or more layers of the metal paste onto the dried metal paste pillar and drying the additional one or more layers of the metal paste so as to increase the height of the dried metal paste pillar;
if the height of the dried metal paste pillar exceeds the desired height, ablating a portion of the dried metal paste pillar so as to decrease the height of the dried metal paste pillar;
sintering the dried metal paste pillar so as to form the conductive pillar, wherein the conductive pillar comprises a bottom layer, one or more intermediate layers and a top layer, and wherein the bottom layer comprises a first type of metal, the one or more intermediate layers comprise a second type of metal different from the first type of metal, and the top layer comprises a third type of metal different from the second type of metal; and
depositing a conductive adhesive on a top surface of the top layer of the conductive pillar,
wherein depositing the conductive adhesive on the top surface of the top layer of the conductive pillar comprises:
placing a second film with a conductive adhesive coating on the top surface of the top layer of the conductive pillar, wherein the conductive adhesive coating comprises the conductive adhesive;
directing a laser beam onto the second film, causing a void to form at an interface between the second film and the conductive adhesive coating, which in turn causes a first portion of the conductive adhesive coating to detach from the second film, the first portion of the conductive adhesive coating adhering to the top surface of the top layer of the conductive pillar and exhibiting a conical shape; and
removing the second film from the top surface of the top layer of the conductive pillar along with a second portion of the conductive adhesive coating still adhering to the second film.

* * * * *